United States Patent
Lee et al.

(10) Patent No.: US 9,985,252 B2
(45) Date of Patent: May 29, 2018

(54) ORGANIC LIGHT-EMITTING DEVICE AND METHOD OF FABRICATING THE SAME

(71) Applicant: SAMSUNG DISPLAY CO., LTD., Yongin, Gyeonggi-Do (KR)

(72) Inventors: Jaeyoung Lee, Yongin (KR); Myoungki Kim, Yongin (KR); Daeyong Yoon, Yongin (KR); Jaesung Lim, Yongin (KR); Jaehoon Hwang, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 363 days.

(21) Appl. No.: 14/671,191

(22) Filed: Mar. 27, 2015

(65) Prior Publication Data

US 2016/0133880 A1    May 12, 2016

(30) Foreign Application Priority Data

Nov. 6, 2014    (KR) .................. 10-2014-0153734

(51) Int. Cl.
*H01L 51/50* (2006.01)
*H01L 51/52* (2006.01)

(52) U.S. Cl.
CPC ...... *H01L 51/5281* (2013.01); *H01L 51/5234* (2013.01); *H01L 51/5275* (2013.01); *H01L 51/5284* (2013.01); *H01L 51/5218* (2013.01)

(58) Field of Classification Search
CPC ..... H01L 51/5218; H01L 51/50; H01L 51/52; H01L 51/5221; H01L 51/5281; H01L 51/5056; H01L 51/5072; H01L 51/5092
USPC ..... 428/411.1, 1.1, 690; 252/301.16; 257/40
See application file for complete search history.

(56) References Cited

U.S. PATENT DOCUMENTS

| | | | |
|---|---|---|---|
| 5,986,401 A | 11/1999 | Thompson et al. | |
| 8,102,118 B2 * | 1/2012 | Lee | H01L 51/5036 257/79 |
| 8,298,630 B2 * | 10/2012 | Nitta | B29C 47/0021 264/211.12 |
| 8,345,223 B2 * | 1/2013 | Soer | B82Y 10/00 355/53 |
| 8,482,093 B2 * | 7/2013 | Tian | H01L 27/14603 257/21 |
| 9,461,269 B2 * | 10/2016 | Lee | H01L 51/5253 |
| 2006/0113907 A1 | 6/2006 | Im et al. | |
| 2009/0096359 A1 * | 4/2009 | Lee | H01L 51/5265 313/504 |
| 2011/0101855 A1 | 5/2011 | Mizuno | |
| 2011/0309739 A1 | 12/2011 | Song et al. | |
| 2012/0280612 A1 * | 11/2012 | Lee | H01L 51/5281 313/504 |
| 2014/0070187 A1 | 3/2014 | Cho et al. | |
| 2014/0145156 A1 * | 5/2014 | Choi | H01L 27/32 257/40 |
| 2017/0294628 A1 * | 10/2017 | Kim | H01L 51/5284 |

FOREIGN PATENT DOCUMENTS

| | | |
|---|---|---|
| KR | 10-2006-0059068 A | 6/2006 |
| KR | 10-2011-0137087 A | 12/2011 |
| KR | 10-2012-0083496 A | 7/2012 |
| KR | 10-2014-0033867 A | 3/2014 |

OTHER PUBLICATIONS

Korean Office Action for 10-2014-0153734 dated Aug. 13, 2015; Lee, et al.

Xie, et al., Reduced ambient reflection of organic light-emitting diodes by utilizing multilayer low-reflection cathodes, Semicond. Sci. Technol. 21, pp. 1077-1081 (2006).

* cited by examiner

*Primary Examiner* — Douglas J McGinty
(74) *Attorney, Agent, or Firm* — Lee & Morse, P.C.

(57) ABSTRACT

Provided is an organic light-emitting device including: a substrate; an anode on the substrate; an organic layer on the anode and including an emission layer; a cathode on the organic layer; an optical auxiliary layer on the cathode; and a capping layer on the optical auxiliary layer, wherein, in a visible light region, the optical auxiliary layer has a lower refractive index and a higher absorption coefficient as the capping layer.

20 Claims, 9 Drawing Sheets

ORGANIC LIGHT-EMITTING DEVICE AND METHOD OF FABRICATING THE SAME

CROSS-REFERENCE TO RELATED APPLICATION

Korean Patent Application No. 10-2014-0153734, filed on Nov. 6, 2014, in the Korean Intellectual Property Office, and entitled: "Organic Light-Emitting Device and Method of Fabricating the Same," is incorporated by reference herein in its entirety.

BACKGROUND

1. Field

One or more exemplary embodiments relate to an organic light-emitting device and a method of fabricating the same, and more particularly, to an organic light-emitting device capable of reducing reflection of external light and a method of fabricating the organic light-emitting device.

2. Description of the Related Art

An organic light-emitting device is a self-emission device that includes an anode, a cathode, and an organic light emission layer disposed between the anode and the cathode. Holes provided from the anode and electrons provided from the cathode recombine in the organic light emission layer and produce excitons. These excitons change from an excited state to a ground state, thereby generating light.

Since the self-emissive organic light-emitting device does not need a separate light source, the organic light-emitting device may be operable at a low voltage and may be configured as a thin, lightweight device. In addition, due to high-quality properties of the organic light-emitting device, such as wide viewing angles, high contrast ratios, and short response times, the organic light-emitting device has attracted attention as a component for forming a next-generation display device.

However, the organic light-emitting device may suffer from contrast degradation or problems in expressing black that are caused by metal electrodes and metal wires, which reflect light (e.g., external light) received from the outside. In order to reduce incidence of such reflection of external light, a polarizing plate and a compensation film are applied to the organic light-emitting device, but there may be reliability problems due to changes in the film properties upon an increase in cost and temperature.

SUMMARY

According to one or more exemplary embodiments, there is provided an organic light-emitting device including: a substrate; an anode formed on the substrate; an organic layer formed on the anode and including an emission layer; a cathode formed on the organic layer; an optical auxiliary layer formed on the cathode; and a capping layer formed on the optical auxiliary layer. Here, the optical auxiliary layer may have a low refractive index and a high absorption coefficient as compared with those of the capping layer, in a visible light region.

The optical auxiliary layer may have a refractive index in a range of about 1.1 to about 2.0 and an absorption coefficient in a range of about 1 to about 3, in the visible light region.

The refractive index of the optical auxiliary layer may be in a range of about 1.1 to about 1.5 in a wavelength region between about 400 nm to about 550 nm, and in a range of about 1.5 to about 2 in a wavelength region between about 550 nm to about 700 nm.

A difference between the refractive index of the optical auxiliary layer and the refractive index of the capping layer may be in a range of about 0.5 to about 2.0 in a wavelength region between about 400 nm and about 550 nm. Here, a difference between the refractive index of the optical auxiliary layer and the refractive index of the capping layer in a wavelength region between about 550 nm and about 700 nm may be smaller than the difference between the refractive index of the optical auxiliary layer and the refractive index of the capping layer is in a range of about 0.5 to about 2.0 in a wavelength region between about 400 nm and about 550 nm.

Meanwhile, the optical auxiliary layer may have a high absorption coefficient in a wavelength region between about 550 nm and about 700 nm as compared with an absorption coefficient of the optical auxiliary layer in a wavelength region between about 400 nm and about 550 nm.

The optical auxiliary layer may include ytterbium (Yb).

The organic layer may further include a hole transport region between the anode and the emission layer and an electrode transport region between the cathode and the emission layer.

The electron transport region may include an electron injection layer made of the same material as a material for forming the optical auxiliary layer.

The capping layer may include a triarylamine derivative, a carbazole derivative, a benzoimidazole derivative, a triazol derivative, or a combination thereof; or ITO, IZO, $SiO_2$, $SiN_x$, $Y_2O_3$, $WO_3$, $MoO_3$, $Al_2O_3$, or a combination thereof.

The cathode may include a first metal such as silver (Ag) and a second metal such as at least one metal, e.g., aluminum (Al), platinum (Pt), ytterbium (Yb), neodymium (Nd), and magnesium (Mg). The content of the second metal may be in a range of about 10 parts to about 20 parts by weight based on 100 parts by weight of the first metal.

The anode may be a reflective electrode.

The capping layer may include a plurality of other layers having a different refractive index from that of the capping layer.

The cathode may further include at least one intermediate layer within the cathode, the intermediate layer being made of the same material as a material for forming the optical auxiliary layer. Here, the optical auxiliary layer and the intermediate layer may include Yb.

According to one or more exemplary embodiments, there is provided a method of fabricating an organic light-emitting device, the method including: providing a substrate; forming an anode on the substrate; forming an organic layer including an emission layer, on the anode; forming a cathode on the organic layer; forming an optical auxiliary layer on the cathode; and forming a capping layer on the optical auxiliary layer.

The optical auxiliary layer may have a low refractive index and a high absorption coefficient as compared with those of the capping layer, in the visible light region.

Formation of the optical auxiliary layer may continuously occur after the formation of the cathode, in a chamber that is the same as a chamber used for the formation of the cathode.

The organic layer may further include a hole transport region formed between the anode and the emission layer and an electrode transport region formed between the cathode and the emission layer.

The electron transport region may include an electron injection layer, and the electron injection layer, the cathode, and the optical auxiliary layer may be sequentially formed in the same chamber.

The electron injection layer and the optical auxiliary layer may be made of the same materials.

Here, the optical auxiliary layer may include Yb.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
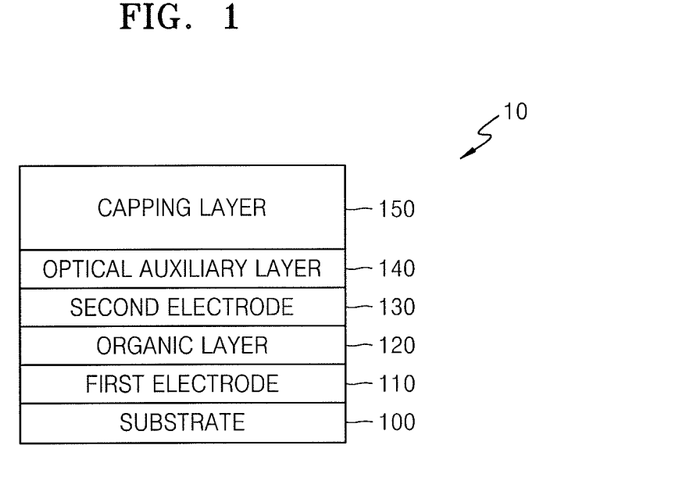
FIG. 1 illustrates a schematic cross-sectional view of an organic light-emitting device according to an embodiment.

FIG. 1 is a schematic cross-sectional view of an organic light-emitting device 10 according to an embodiment. The organic light-emitting device 10 includes a substrate 100 and a first electrode 110, an organic layer 120, a second electrode 130, an optical auxiliary layer 140, and a capping layer 150, which are sequentially formed on the substrate 100. Hereinafter, each layer of the organic light-emitting device 10 will be described in detail.

For use as the substrate 100, any substrate that is used in a typical organic light-emitting device may be used. The substrate 100 may be a glass substrate or a transparent plastic substrate, each of which has excellent mechanical strength, thermal stability, transparency, surface smoothness, ease of handling, and water-proofness. In addition, the substrate 100 may be formed of an opaque material, such as silicon or stainless steel.

The first electrode 110 may be formed on the substrate 100, and the first electrode 100 may be an anode. Here, the first electrode 110 may be a reflective electrode. The first electrode 110 may include, for example, a reflective film made of silver (Ag), magnesium (Mg), aluminum (Al), platinum (Pt), palladium (Pd), aurum (Au), nickel (Ni), neodymium (Nd), iridium (Ir), chromium (Cr), or an alloy thereof; and a transparent or semi-transparent electrode layer having a high work function and formed on the reflective film.

The transparent or semi-transparent electrode layer may be formed of, for example, indium tin oxide (ITO), indium zinc oxide (IZO), zinc oxide (ZnO), aluminum zinc oxide (AZO), indium gallium oxide (IGO), indium oxide ($In_2O_3$), or tin oxide ($SnO_2$).

The organic layer 120 may include an emission layer (EML), and a hole transport region may be formed between the EML and the first electrode 110 and an electron transport region may be formed between the EML and the second electrode 130. The hole transport region may include at least one of a hole injection layer (HIL), a hole transport layer (HTL), and an electron blocking layer (EBL). The electron transport region may include at least one of a hole blocking layer (HBL), an electron transport layer (ETL), and an electron injection layer (EIL). The organic layer 120 may be formed to a thickness in a range of about 1,000 Å to about 10,000 Å.

The second electrode 130 may be formed on the organic layer 120, and the second electrode 130 may be a cathode. Here, the second electrode 130 may be a transmissive or semi-transmissive electrode. The second electrode 130 may be formed as, for example, a thin film made of Li, Ca, LiF/Ca, LiF/Al, Al, Ag, Mg, or an alloy thereof and having a low work function. In detail, the second electrode 130 may be formed of an alloy that includes Ag and at least one metal, e.g., Al, Pt, Yb, Nd, and Mg. Here, the content (i.e., weight) of Ag in the alloy may be the same with or greater than the content of the other metals. For example, the weight ratio of Ag to the other metals of the alloys may be in a range of 50:50 to 90:10, or in a range of 60:40 to 80:20. For example, the second electrode 130 may be formed of Ag—Mg alloys, in which the weight ratio of Ag to Mg is in a range of 60:40 to 80:20. Alternatively, the second electrode 130 may be formed of alloys including at least one metal, e.g., silver (Ag), gold (Au), platinum (Pt), copper Cu), manganese (Mn), titanium (Ti), cobalt (Co), nickel (Ni), and tungsten (W), and at least one metal, e.g., ytterbium (Yb), scandium (Sc), vanadium (V), yttrium (Y), indium (In), cerium (Ce), samarium (Sm), europium (Eu), and terbium (Tb). These metal films may be formed as a transparent or semi-transparent electrode by adjusting the thickness of the films.

Accordingly, light generated from the organic layer 120 may be emitted through the second electrode 130. For example, the second electrode 130 may be formed to a thickness in a range of about 50 Å to about 300 Å.

The optical auxiliary layer 140 on the second electrode 130 may be formed of a material having a low refractive index and a high absorption coefficient as compared with those of a material for forming the capping layer 150. For example, the optical auxiliary layer 140 may be formed of a material having a refractive index in a range of about 1.1 to about 2 and an absorption coefficient (or an attenuation coefficient) in a range of about 1 to about 3, in a visible light region. Here, the refractive index is a real part of a complex index of refraction and the absorption coefficient is an imaginary part of a complex refractive index.

The material of the optical auxiliary layer 140 may have a low refractive index, specifically in a short-wavelength region in the visible light region rather than a long-wavelength region in the visible light region, and a high absorption coefficient specifically in a long-wavelength region rather than a short-wavelength region in the visible light region. For example, a refractive index of the material of the optical auxiliary layer 140 may be in a range of about 1.1 to about 1.5 in a wavelength region between about 400 nm to about 550 nm, and in a range of about 1.5 to about 2 in a wavelength region between about 550 nm to about 700 nm. An absorption coefficient of the material of the optical auxiliary layer 140 may be in a range of about 1.5 to about 3 in a wavelength region between about 550 nm to about 700 nm. The difference between the refractive index of the material for the optical auxiliary layer 140 and the refractive index of the material for the capping layer 150 may be in a range of, for example, about 0.5 to about 2.0 in a wavelength region between about 400 nm to about 550 nm and/or in a range of about 0.1 to about 1.0 in a wavelength region between about 550 nm to about 700 nm. In some embodiments, the optical auxiliary layer 140 may have a higher refractive index than that of the second electrode 130.

Examples of the material for forming the optical auxiliary layer 140 include Yb Mg, and the like. The thickness of the optical auxiliary layer 140 may be, for example, in a range of about 1 nm to about 100 nm.

The low refractive index of the optical auxiliary layer 140 in the short-wavelength region of the visible light region may result in a larger difference between the refractive index of the optical auxiliary layer 140 and the refractive index of the capping layer 150 at an interface therebetween, as well as a larger difference between the refractive index of optical auxiliary layer 140 and the refractive index of the second electrode 130 at an interface therebetween. Accordingly, constructive interference of the short-wavelength regions may occur within the optical auxiliary layer 140. In addition, the high refractive index of the optical auxiliary layer 140 in the long-wavelength region of the visible light region may result in a smaller difference between the refractive index of the optical auxiliary layer 140 and the refractive index of the capping layer 150 at an interface therebetween. Accordingly, constructive interference of the long-wavelength regions may occur within a region combined with the optical auxiliary layer 140 and the capping layer 150. That is, a material having a low refractive index in the short-wavelength region of the visible light and a high refractive index in the long-wavelength region of the visible light may be used to form the optical auxiliary layer 140, so that all the regions of the visible light may be enhanced by constructive interference. Accordingly, the organic light-emitting device 10 may improve light extraction efficiency.

In addition, due to a high absorption coefficient of the optical auxiliary layer 140 as compared with that of the capping layer 150, the optical auxiliary layer 140 may improve the contrast ratio thereof by absorbing external light. Human eyes are more sensitive to yellow or red color than the blue or green. Thus, the optical auxiliary layer 140 may increase the contrast ratio due to absorption of external light. Light generated by the EML may be also absorbed by the optical auxiliary layer 140 due to increased absorption of long wavelength light in the visible region. However, the increased constructive interference by the optical auxiliary layer 140 may prevent a reduction in the efficiency of light extraction.

The capping layer 150 formed on the optical auxiliary layer 140 may include an organic material, an inorganic material, or a combination thereof.

The organic material of the capping layer 150 may include a triarylamine derivative, a carbazole derivative, a benzoimidazole derivative, a triazol derivative, or a mixture thereof. Examples of the organic material of the capping layer 150 may be 4,4'-bis[N-(3-methylphenyl)-N-phenylamino]biphenyl (TPD), 4,4',4''-tris[(3-methylphenyl)phenylamino]triphenylamine (m-MTDATA), 1,3,5-tris[N,N-bis(2-methylphenyl)-amino]-benzene (o-MTDAB), 1,3,5-tris[N,N-bis(3-methylphenyl)-amino]-benzene (m-MTDAB), 1,3,5-tris[N,N-bis(4-methylphenyl)-amino]-benzene (p-MTDAB), 4,4'-bis[N,N-bis(3-methylphenyl)-amino]-diphenylmethane (BPPM), 4,4'-dicarbazolyl-1,1'-biphenyl (CBP), 4,4',4''-tris(N-carbazol)triphenylamine (TCTA), 2,2',2''-(1,3,5-benzentolyl)tris-[1-phenyl-1H-benzoimidazole](TPBI), 3-(4-biphenyl)-4-phenyl-5-t-butylphenyl-1,2,4-triazol (TAZ), and the like.

The inorganic material of the capping layer 150 may include ITO, IZO, $SiO_2$, $SiN_x$, $Y_2O_3$, $WO_3$, $MoO_3$, or $Al_2O_3$.

A thickness of the capping layer 150 may be in a range of about 10 nm to about 1,000 nm. The capping layer 150 may be formed in two or more layers by alternately using a material having a high refractive index and a material having a low refractive index. Accordingly, the multi-layered capping layer 150 may cause constructive interference, thereby increasing the efficiency of light extraction.

Figure 2:
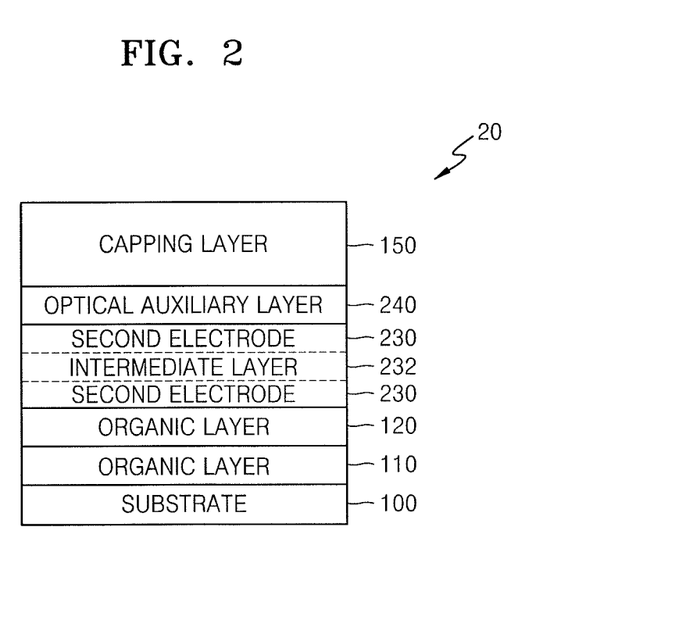
FIG. 2 illustrates a schematic cross-sectional view of an organic light-emitting device according to another embodiment.

FIG. 2 is a schematic cross-sectional view of an organic light-emitting device 20 according to another embodiment. The organic light-emitting device 20 of FIG. 2 is different from the organic light-emitting device 10 of FIG. 1 due to the addition of an intermediate layer 232 within a second electrode 230. The intermediate layer 232 may be formed of the same material as the optical auxiliary layer 240. The intermediate layer 232 may be formed to a thickness in a range of about 1 nm to about 100 nm. The organic light-emitting device 20 may be configured in a multi-resonance structure by using the intermediate layer 232, and accordingly, may increase the efficiency of light extraction. The second electrode 230 may optionally include two or more intermediate layers 232 that are spaced apart from each other. For example, the second electrode 230 may have a stacked structure of the second electrode/intermediate layer/second electrode/intermediate layer/second electrode. When the second electrode 230 includes two or more intermediate layers 232, light with long wavelengths within the visible range may be absorbed more. Accordingly, the organic light-emitting device 20 may reduce light reflection.

Figure 3:
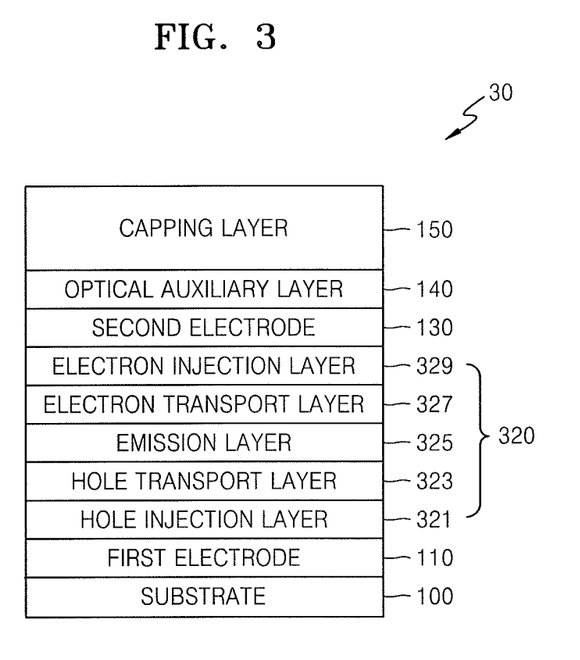
FIG. 3 illustrates a schematic cross-sectional view of an organic light-emitting device according to another embodiment.

FIG. 3 is a schematic cross-sectional view of an organic light-emitting device 30 according to another embodiment. The organic light-emitting device 30 of FIG. 3 includes an organic layer 320. The organic layer 320 sequentially includes an HIL 321, an HTL 323, an EML 325, an ETL 327, and an EIL 329. The substrate 100, the first electrode 110, the second electrode 130, the optical auxiliary layer 140, and the capping layer 150 of the organic light-emitting device 30 may be defined the same as those of the organic light-emitting device 10 of FIG. 1.

The HIL 321 may be formed of, for example, a phthalocyanine compound, such as copper phthalocyanine, a diamine or triamine compound, such as N,N'-diphenyl-N,N'-bis-[4-(phenyl-m-tolyl-amino)-phenyl]-biphenyl-4,4'-diamine (DNTPD), 4,4',4''-tris(3-methylphenylphenylamino)triphenylamine (m-MTDATA), 4,4'4''-tris(N,N-diphenylamino)triphenylamine (TDATA), or 4,4',4''-tris{N,-(2-naphthyl)-N-phenylamino}-triphenylamine (2T-NATA), or a high molecular compound, such as poly(3,4-ethylenedioxythiophene)/poly(4-styrenesulfonate) (PEDOT/PSS), polyaniline/dodecylbenzenesulfonic acid (PANI/DBSA), polyaniline/camphor sulfonicacid (PANI/CSA), or polyaniline/poly(4-styrenesulfonate) (PANI/PSS), but the examples of the material for forming the HIL 321 are not limited thereto.

The HTL 323 may be formed of, for example, a carbazole derivative, such as N-phenylcarbazole or polyvinylcarbazole, a triphenylamine-based compound, such as N,N'-bis(3-methylphenyl)-N,N'-diphenyl-[1,1-biphenyl]-4,4'-diamine (TPD) or 4,4',4''-tris(N-carbazolyl)triphenylamine (TCTA), or N,N'-di(1-naphthyl)-N,N'-diphenylbenzidine (NPB), but the examples of the material for forming the HTL 323 are not limited thereto.

At least one of the HIL 321 and the HTL 323 may further include a charge-generation material for improving conductive properties of the layers. The charge-generation material may be, for example, a p-dopant. Non-limiting examples of the p-dopant are a quinone derivative, such as tetracyanoquinonedimethane (TCNQ) and 2,3,5,6-tetrafluoro-tetracyano-1,4-benzoquinonedimethane (F4-TCNQ), or a metal oxide, such a tungsten oxide and a molybdenum oxide, but are not limited thereto.

The EML 325 may include, for example, a host and a dopant.

For use as the host, any appropriate material in the art may be used. Examples thereof include tris(8-quinolinolate)aluminum ($Alq_3$), 4,4'-bis(N-carbazolyl)-1,1'-biphenyl (CBP), poly(n-vinylcabazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBI), 3-tert-butyl-9,10-di(naphth-2-yl)anthracene (TBADN), distyrylarylene (DSA), E3, or 4,4'-bis(9-carbazolyl)-2,2'-dimethyl-biphenyl (CDBP), but are not limited thereto.

For use as the dopant, any appropriate material known in the art may be used. Examples thereof include a fluorescent dopant, a phosphorescent dopant, or a delayed fluorescent dopant. The phosphorescent dopant may be an organic metal complex including iridium (Ir), platinum (Pt), osmium (Os), rhenium (Re), titanium (Ti), zirconium (Zr), hafnium (Hf), or a combination of two or more of these elements, but the phosphorescent dopant is not limited thereto.

Examples of a red dopant include Pt(II) octaethylporphine (PtOEP), tris(2-phenylisoquinoline)iridium ($Ir(piq)_3$), or bis(2-(2'-benzothienyl)-pyridinato-N,C3')iridium(acetylacetonate) $Btp_2Ir(acac)$, but are not limited thereto.

Examples of a green dopant include tris(2-phenylpyridine)iridium ($Ir(ppy)_3$), bis(2-phenylpyridine)(acetylacetonato)iridium(III) ($Ir(ppy)_2(acac)$), tris(2-(4-tolyl)phenylpyridine)iridium ($Ir(mppy)_3$), or 10-(2-benzothiazolyl)-1,1,7,7-tetramethyl-2,3,6,7-tetrahydro-1H,5H,1H-[1]benzopyrano[6,7,8-ij]-quinolizin-11-one (C545T), but are not limited thereto.

Examples of a blue dopant include bis[3,5-difluoro-2-(2-pyridyl)phenyl](picolinato)iridium(III) ($F_2Irpic$), $(F_2ppy)_2Ir(tmd)$, $Ir(dfppz)_3$,4,4'-bis(2,2'-diphenylethen-1-yl)biphenyl (DPVBi), 4,4'-bis[4-(diphenylamino)styryl]biphenyl (DPAVBi), or 2,5,8,11-tetra-tert-butyl perylene (TBPe), but are not limited thereto.

The ETL 327 may be formed of, for example, such as $Alq_3$, 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-Biphenyl-4-olato)aluminum (BAlq), beryllium bis(benzoquinolin-10-olate) ($Bebq_2$), or 9,10-di(naphthalene-2-yl)anthrascene (ADN), but the examples of the material for forming the ETL 327 are not limited thereto.

The ETL 327 may further include a metal-containing material, and the metal-containing material may include a lithium (Li) complex. A non-limiting example of the Li complex may be lithium quinolate (LiQ).

The EIL 329 may be formed of, for example, an alkali metal, an alkali earth metal, a halide of the alkali metal and the alkali earth metal, an oxide, or a carbonate. For example, the EIL 329 may include, e.g., Li, Ca, Sr, LiF, NaCl, CsF, CsCl, $MgF_2$, $CaF_2$, $SrF_2$, $BaF_2$, $Li_2O$, $Na_2O$, MgO, SrO, BaO, $Li_2CO_3$, and $MgCO_3$. In some embodiments, the EIL 329 may include at least one metal, e.g., Yb, Sc, V, Y, In, Ce, Sm, Eu, and Tb. For example, the EIL 329 may include Yb. In some other embodiments, the EIL 329 may include, for example, a halide of the alkali metal or the alkali earth metal in addition to at least one metal, e.g., Yb, Sc, V, Y, In, Ce, Sm, Eu, and Tb.

In some embodiments, the organic light-emitting device 30 may include Yb for forming the EIL 329, Ag and Mg (in which the content of Ag is predominant over the content of Mg) for forming the second electrode 130, and Yb again for forming the optical auxiliary layer.

Figure 4:
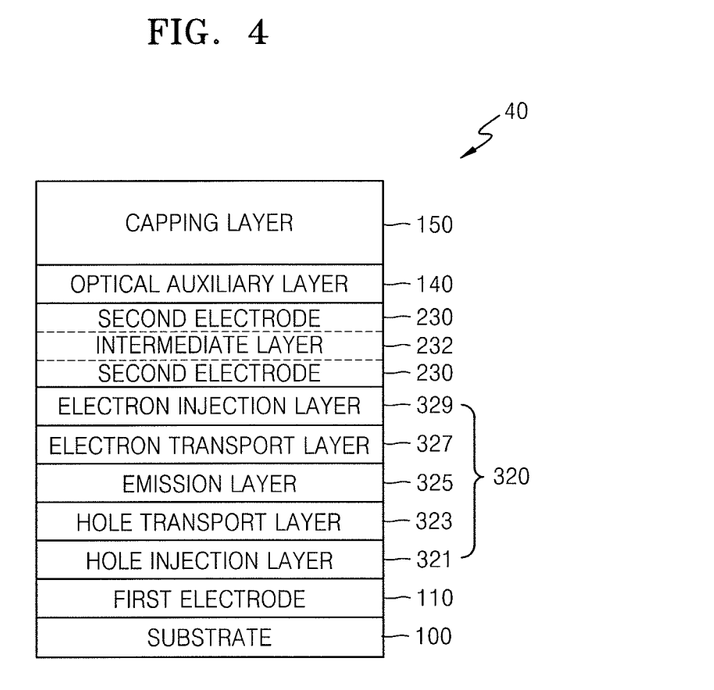
FIG. 4 illustrates a schematic cross-sectional view of an organic light-emitting device according to another embodiment.

FIG. 4 is a schematic cross-sectional view of an organic light-emitting device 40 according to another embodiment. The organic light-emitting device 40 of FIG. 4 includes the substrate 100, the first electrode 110, the organic layer 320, the second electrode 230, the optical auxiliary layer 140, and the capping layer 150, wherein the organic layer 320 includes the HIL 321, the HTL 323, the EML 325, the ETL 327, and the EIL 329. The substrate 100, the first electrode 110, the organic layer 320, the optical auxiliary layer 140, and the capping layer 150 of the organic light-emitting device 40 may be defined the same as those of the organic light-emitting device 30 of FIG. 3. In addition, the second electrode 230 of the organic light-emitting device 40 may further include the intermediate layer 232, which is defined the same as that of the organic light-emitting device 20.

Figure 5:
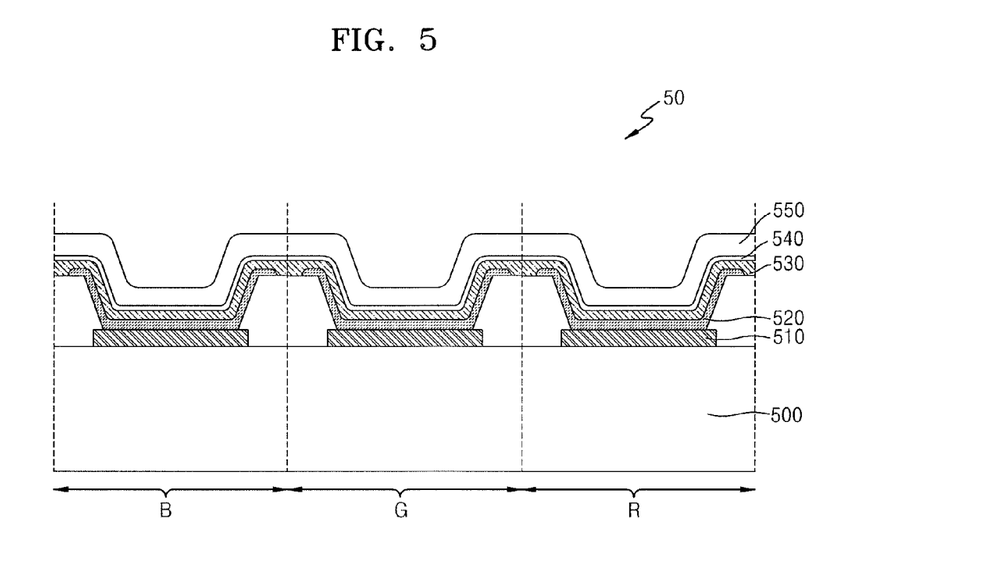
FIG. 5 illustrates a schematic cross-sectional view of an organic light-emitting device according to another embodiment.

FIG. 5 is a schematic cross-sectional view of an organic light-emitting device 50 according to another embodiment. Referring to FIG. 5, the organic light-emitting device 50 is a full-color device including a red sub-pixel (R), a green sub-pixel (G), and a blue sub-pixel (B).

The organic light-emitting device 50 has a stacked structure of a substrate 500 and a first electrode 510, an organic layer 520, a second electrode 530, an optical auxiliary layer 540, and a capping layer 550, which are sequentially stacked on the substrate 500 in each of the sub-pixels R, G, and B. The substrate 500, the first electrode 510, the organic layer 520, the optical auxiliary layer 540, and the capping layer 550 may be defined the same as the substrate 100, the first electrode 110, the organic layer 120, the optical auxiliary layer 140, and the capping layer 150 of the organic light-emitting device 10 of FIG. 1. Although the organic layer 520 illustrated in FIG. 5 is separated in each of the sub-pixels R, G, and B, other layers of the organic layer 520, except the EML, may be commonly formed over the all of the sub-pixels R, G, and B. In some embodiments, the organic layer 520 may be formed in a different thickness in each of the sub-pixels R, G, and B, so that the organic light-emitting device 520 may have a resonance structure.

The second electrode 530 is a layer that is commonly formed over the all of the sub-pixels R, G, and B. Here, the second electrode 520 may be a single layer like the second electrode 130 of the organic light-emitting device 10 of FIG. 1, or may additionally include the intermediate layer like the intermediate layer 232 of the organic light-emitting device 20 of FIG. 2.

The optical auxiliary layer 540 is a layer that is commonly formed over the all of the sub-pixels R, G, and B.

Figure 6:
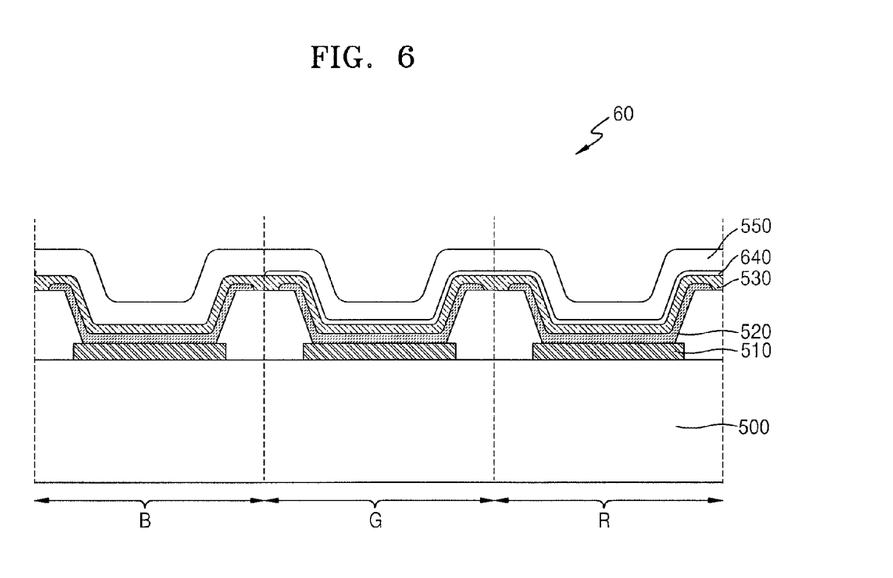
FIG. 6 illustrates a schematic cross-sectional view of an organic light-emitting device according to another embodiment.

FIG. 6 is a schematic cross-sectional view of an organic light-emitting device 60 according to another embodiment. Referring to FIG. 6, the organic light-emitting device 60 is a full-color device including a red sub-pixel (R), a green sub-pixel (G), and a blue sub-pixel (B). The organic light-emitting device 60 is different from the organic light-emitting device 50 in that an optical auxiliary layer 640 is formed only in the green sub-pixel G region and the red sub-pixel G region, and is not formed in the blue sub-pixel B region. In this regard, the organic light-emitting device 60 may have a high absorption coefficient at the long wavelengths, and accordingly, may increase the contrast ratio improvement upon absorption of external light.

Figure 7:
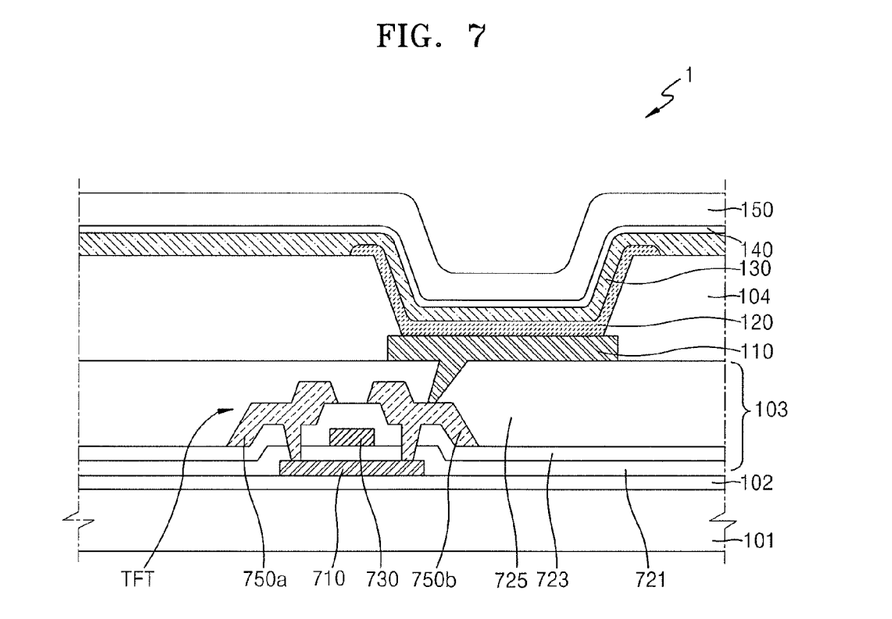
FIG. 7 illustrates a schematic cross-sectional view of an organic light-emitting display device including an organic light-emitting device according to an embodiment.

FIG. 7 is a schematic cross-sectional view of an organic light-emitting display device 1 including an organic light-emitting device according to an embodiment.

Referring to FIG. 7, the organic light-emitting display device 1 includes a substrate 101, a thin film transistor (TFT) on the substrate 101, the first electrode 110 electrically connected to the TFT, the organic layer 120 on the first electrode 110, the second electrode 130 on the organic layer 120, the optical auxiliary layer 140 on the second electrode 130, and the capping layer 150 on the optical auxiliary layer 140.

Any substrate used in a typical organic light-emitting device may be used as the substrate 101. The substrate 101 may be a glass substrate or a transparent plastic substrate, i.e., any substrate having excellent mechanical strength, thermal stability, transparency, surface smoothness, ease of handling, and water-proofness. Alternatively, the substrate 101 may be formed of an opaque material, such as silicon or stainless steel.

A device/wiring layer 103 may be disposed on the substrate 101, wherein the device/wiring layer 103 includes a driving TFT, a switching TFT (not illustrated), a capacitor, and wires that are connected with these TFTs or the capacitor, for the operation of the organic light-emitting device 10.

The driving TFT may include an active layer 710, a gate electrode 730, and source and drain electrodes 750a and 550b. Here, the active layer 710 and the gate electrode 730 may be insulated by a gate insulating layer 721. An insulating layer 723 may be between the gate electrode 730 and the source and drain electrodes 750a and 750b. An interlayer insulating layer 725 may be between the driving TFT and the first electrode 110.

The organic light-emitting display device 1 may further include a barrier layer 102 in order to prevent external foreign materials, such as moisture or oxygen between the substrate 101 and the device/wiring layer, from penetrating the substrate 101 and invading the device/wiring layer 103 and the organic light-emitting device 10. Here, the barrier layer 102 may be formed of inorganic materials and/or organic materials.

The organic light-emitting device 10 may be on the device/wiring layer 103. The organic light-emitting device 10 may include the first electrode 110, the organic layer 120 on the first electrode 110, the second electrode 130 on the organic layer 120, the optical auxiliary layer 140 on the second electrode 130, and the capping layer 150 on the optical auxiliary layer 140. The organic light-emitting device 10 may be the organic light-emitting device of FIG. 1.

In an embodiment, the first electrode 110 may be an anode and the second electrode 130 may be a cathode. Holes from the first electrode 110 and electrons from the second electrode 130 move towards inside the organic EML 120. The holes and electrons recombine to produce excitons. These excitons change from an excited state to a ground state, thereby generating light.

The first electrode 110 may be electrically connected with the source or drain electrode 750a or 750b of the driving TFT on the device/wiring layer 103.

In an embodiment, the configuration of the organic light-emitting device 10 is described such that the driving TFT is formed on the device/wiring layer 103, but the configuration is not limited thereto. For example, the organic light emitting-device 10 may be formed in various structures, such as a structure in which the first electrode 110 is on the same layer as the active layer 510 of the TFT, a structure in which the first electrode 110 is on the same layer as the gate electrode 530 of the TFT, or a structure in which the first electrode 110 is on the same layer as the source and drain electrodes 750a and 750b.

An exemplary structure provided herein is that the gate electrode 530 of the driving TFT is formed on the active layer 510, but the structure is not limited thereto. For example, the organic light-emitting device 10 may have the gate electrode 530 of the TFT below the active layer 510.

In some embodiments, the organic light-emitting device 20 of FIG. 2 instead of the organic light-emitting device 10 of FIG. 1 may be applied to the organic light-emitting display device 1. In addition, the organic layer 120 may include, as shown in the organic light-emitting devices 30 and 40 of FIGS. 3 and 4, an HIL 321, an HTL 323, an EML 325, an ETL 327, and an EIL 329. In some other embodiments, the organic layer 120 may include only some of these layers or may further include other layers.

The organic light-emitting display device 1 of FIG. 7 is configured to have a single pixel only, but as illustrated in FIG. 5 or FIG. 6, a full-color organic light-emitting device including a red sub-pixel, a green sub-pixel, and a blue sub-pixel may be applied in the organic light-emitting display device 1.

Hereinafter, the structure of the organic light-emitting device according to an embodiment and a method of fabricating the organic light-emitting device according to an embodiment will be described in connection with FIG. 5.

The materials for forming each layer of the organic light-emitting device or the organic light-emitting display device, or the thickness of each layer of the organic light-emitting device or the organic light-emitting display device may refer to the description provided hereinbefore.

Referring to FIG. 5 again, the organic light-emitting device 10 may include the device/wiring layer 103, the first electrode 110, the organic layer 120, the second electrode 130, the optical auxiliary layer 140, and the capping layer 150, on the substrate 101.

The barrier layer 102 may be formed before the device/wiring layer 103 is formed on the substrate 101, and may the barrier layer 102 may be formed of inorganic materials and/or organic materials. In this regard, the barrier layer 102 may serve to prevent foreign materials from penetrating the substrate 101 and invading the device/wiring layer 103 and the organic light-emitting device 10.

The device/wiring layer 103 may include a driving TFT, a capacitor (not illustrated), and wires (not illustrated), for the operation of the organic light-emitting device 10.

The first electrode 110, the organic layer 120, and the second electrode 130 may be sequentially formed in the stated order on the device/wiring layer 103.

The first electrode 110 may be a reflective electrode and the second electrode 130 may be a transmissive electrode or a semi-transmissive electrode. Thus, light generated from the organic layer 120 may be directly emitted toward the second electrode 130 or may be reflected by the first electrode 110 to be emitted toward the second electrode 130. Here, the second electrode 130 may serve as a semi-transmissive electrode, so as to form a resonance structure defined by the first electrode 110 and the second electrode 130. The first electrode 110 may be formed by, for example, a deposition method or a sputtering method. The second electrode 130 may be formed by, for example, a vacuum deposition method.

The organic layer 120 may be formed of, low molecular organic materials or high molecular organic materials. The organic layer 120 may be formed by various methods, such as vacuum deposition, spin coating, casting, and a Langmuir-Blodgett (LB) method. An exemplary embodiment provides a case where the organic light-emitting device 10 is formed on the device/wiring layer 103, but structure is not limited thereto. For example, the device/wiring layer 103 and the organic light-emitting device 10 may be formed on the same layer.

The optical auxiliary layer 140 may be formed on the second electrode 130, by using a vacuum deposition method. Formation of the second electrode 130 and the optical auxiliary layer 140 may be continuously performed in the same vacuum deposition chamber. Alternatively, in the case of the organic layer 120 including an EIL, the formation of the EIL, the second electrode 130, and the optical auxiliary layer 140 may be continuously performed in the same vacuum deposition chamber.

For example, when the second electrode 130 is formed of an alloy of Ag and Mg and the optical auxiliary layer 140 is formed of Yb, these Ag, Mg, and Yb material sources may be prepared in the same chamber. During the formation of the second electrode 130, the Ag and Mg material sources are opened to co-deposit Ag and Mg while the Yb material source is blocked. Next, the Ag and Mg material sources are blocked while the Yb material source is open, so as to deposit Yb. Alternatively, the Ag and Mg source are blocked while the Yb source is open, so as to form an EIL, and then, the Ag and Mg source is opened while the Yb source is blocked, so as to co-deposit Ag and Mg, thereby forming the second electrode 130, and then the Ag and Mg material sources are blocked while the Yb source material is opened, so as to form the optical auxiliary layer 140 made of Yb.

By continuously forming the second electrode 130 and the optical auxiliary layer 140 in the same vacuum deposition chamber, the organic light-emitting device and the organic light-emitting display device may be fabricated in a simple method. Accordingly, the processing time and cost for fabricating the products may be reduced.

The capping layer 150 may be formed on the optical auxiliary layer 140, using various methods, such as vacuum deposition, spin coating, casting, and LB method.

In some embodiments, the organic light-emitting display device 1 may use the organic light-emitting device 20 instead of the organic light-emitting device 10. In addition, the organic layer 120 may include, as shown in the organic light-emitting devices 30 and 40 of FIGS. 3 and 4, an HIL 321, an HTL 323, an EML 325, an ETL 327, and an EIL 329. In some other embodiments, the organic layer 120 may include only some of these layers or may further include other layers.

In addition, a light-emitting display device including the full-color organic light-emitting device of FIG. 5 or FIG. 6 may be fabricated by referring to the method of fabricating the organic light-emitting display device 1 of FIG. 7.

That is, the organic light-emitting devices according to these embodiments may be configured in various structures, such as an organic light-emitting device emitting a single color, multiple colors, or white color.

Measurement of Refractive Index

Figure 8:
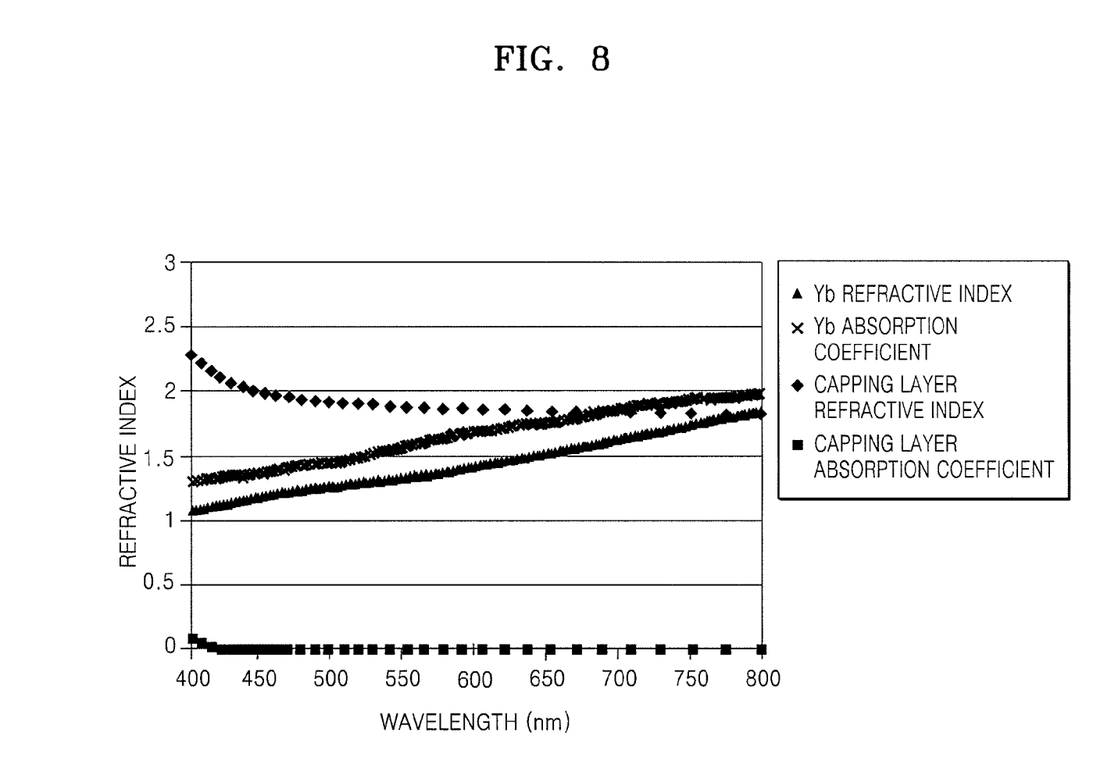
FIG. 8 illustrates a graph showing refractive indices and absorption coefficients of a capping layer and an optical auxiliary layer, according to wavelengths.

FIG. 8 is a graph showing refractive indices and absorption coefficients of Yb of an optical auxiliary layer and Compound A (illustrated below) of a capping layer, according to wavelengths.

In the graph of FIG. 8, the refractive indices denote real parts of complex refractive indices and the absorption coefficients denote imaginary parts of complex refractive indices. Here, the refractive indices and the absorption coefficients were measured by using an ellipsometer.

Referring to the graph of FIG. 8, the refractive index of Yb is lower than that of Compound A. Here, the shorter wavelength, the smaller refractive index of Yb. Accordingly, the difference between the refractive index of the Yb and the refractive index of Compound A increases. Due to the smaller refractive index of Yb relative to that of Compound A, Yb may be used between a cathode electrode and a capping layer such that light emitted from an organic layer may be influenced by the constructive interference.

In addition, referring to the graph of FIG. 8, the absorption coefficient of Yb is higher than that of Compound A. That is, in the case of using a Yb layer on top of a cathode electrode, external light is absorbed by the Yb layer and the reflection of external light by the cathode electrode may be effectively reduced.

<Compound A>

Reflectivity Simulation

Figure 9:
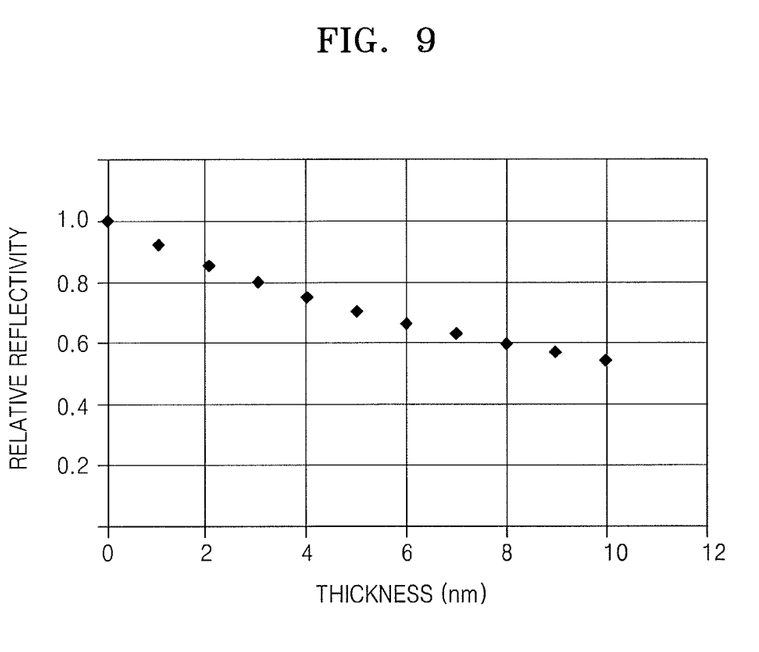
FIG. 9 illustrates a graph showing simulated reflectivity results of an organic light-emitting device, according to thickness of an optical auxiliary layer.

FIG. 9 is a graph showing simulated reflectivity results of organic optical elements according to thickness of the optical auxiliary layer using Yb. In the simulation of FIG. 9, it was assumed that the organic optical elements had a stacked structure of air/optical auxiliary layer/cathode/organic layer/anode without using a polarizing plate. Here, reflectivity was simulated under assumption that a light source was natural daylight (D6500). In the graph of FIG. 9, the reflectivity with the optical auxiliary layer was divided by the reflectivity without the optical auxiliary layer in the same structures, resulting in relative reflectivity of the organic optical elements. Referring to FIG. 9, it was confirmed that the reflectivity was reduced by about 50% with increasing thickness of the optical auxiliary layer using Yb.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Measurement of Reflectivity and Efficiency of Panels

EXAMPLE 1

On top of low temperature polysilicon substrate (LTPS), an organic light-emitting device was fabricated in a stacked structure of ITO (7 nm)/HTL/EML/ETL/Yb (1.5 nm)/Ag:Mg (90:10 volume ratio, 10 volume % of Mg) (9 nm)/Yb (1 nm)/capping layer (85 nm).

COMPARATIVE EXAMPLE 1

On top of LTPS, an organic light-emitting device was fabricated in a stacked structure of ITO (7 nm)/HTL/EML/ETL/LiQ (1.5 nm)/Ag:Mg (10:90 volume ratio, 90 volume % of Mg) (15 nm)/capping layer (65 nm).

COMPARATIVE EXAMPLE 2

On top of LTPS, an organic light-emitting device was fabricated in a stacked structure of ITO (7 nm)/HTL/EML/ETL/Yb (1.5 nm)/Ag:Mg (90:10 volume ratio, 10 volume % of Mg) (9 nm)/capping layer (85 nm).

Compound A was used as a capping layer in Example 1, Comparative Example 1, and Comparative Example 2.

Table 1 below shows values of the panels of Example 1 and Comparative Examples 1 and 2, obtained by using specular component included (SCI) and specular component excluded (SCE) reflectance measurements. Here, the smaller the Y values of the SCI and SCE, the lower reflectivity the panels have. The SCI and SCE reflectance was measured using a Minolta reflectivity meter.

TABLE 1

| | Cathode (volume ratio) | Optical auxiliary layer | Capping layer | Reflectivity | SCI | SCE | Efficiency |
|---|---|---|---|---|---|---|---|
| Comparative Example 1 | Ag:Mg (10:90) | — | Compound A | Y<br>x<br>y | 5.27<br>0.2947<br>0.3142 | 0.431<br>0.2356<br>0.2651 | 90 |
| Comparative Example 2 | Ag:Mg (90:10) | — | Compound A | Y<br>x<br>y | 5.97<br>0.2903<br>0.3163 | 0.7<br>0.2446<br>0.3015 | 100 |

TABLE 1-continued

| | Cathode (volume ratio) | Optical auxiliary layer | Capping layer | Reflectivity | SCI | SCE | Efficiency |
|---|---|---|---|---|---|---|---|
| Example 1 | Ag:Mg (90:10) | Yb | Compound A | Y<br>x<br>y | 5.58<br>0.2915<br>0.3134 | 0.49<br>0.2312<br>0.2753 | 97.2 |

Referring to Table 1, the external light reflection values decreases in the order of the panel of Comparative Example 1, the panel of Example 1, and the panel of Comparative Example 2. Here, the panel of Example 1 showed a slightly larger external light reflection value than that of the panel of Comparative Example 1, but the panel of Comparative Example 2 showed a significantly larger external light reflection values than that of the other panels.

Table 1 showed efficiency values of the panels of Example 1 and Comparative Examples 1 and 2 when efficiency of the panel of Comparative Example 1 was considered as 100. Here, the efficiency values of the panels were compared to each other by measuring current efficiencies (Cd/mA) thereof.

Referring to Table 1, the efficiency is good in the order of the organic light-emitting devices of Comparative Example 2, Example 1, and Comparative Example 1.

That is, the organic light-emitting device of Comparative Example 1 had the smallest external light reflection and the least efficiency, whereas the organic light-emitting device of Comparative Example 2 had excellent efficiency and significantly high light reflection. Meanwhile, the organic light-emitting device of Example 1 had a similar light reflection value to that of the organic light-emitting device of Comparative Example 1. The organic light-emitting device of Example 1 had a similar efficiency to that of the organic light-emitting device of Comparative Example 2. Thus, the organic light-emitting device of Example 1 had excellent properties in terms of both external light reflection and efficiency.

Simulation

The organic light-emitting device using multi-layers of the cathode and the optical auxiliary was simulated regarding efficiency thereof.

The organic light-emitting device having a layered structure below was simulated regarding efficiency thereof in Example 2 and Example 3.

EXAMPLE 2 (Single Layer)

Ag/ITO/HTL/EML/ETL/EIL/cathode/Yb/CPL

EXAMPLE 3 (Multiple Layer)

Ag/ITO/HTL/EML/ETL/EIL/cathode/Yb/CPL/Yb/CPL

CPL is a capping layer in Example 2 and Example 3.

Figure 10:
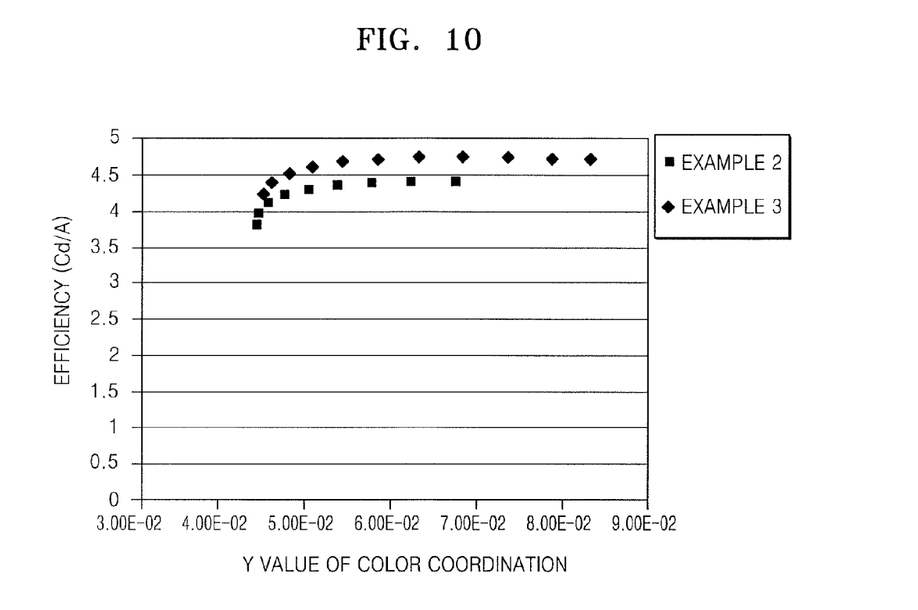
FIG. 10 illustrates a graph showing simulated efficiency results of organic light-emitting devices of Examples 2 and 3 with respect to Y values of light emission color coordinates.

FIG. 10 is a graph showing simulated efficiency of the organic light-emitting devices (blue diodes) of Examples 2 and 3 according to Y values of light emission color coordinate of the organic light-emitting devices. Here, the ranges of emission colors were limited to a blue region. When the Y value of color coordinate becomes high, blue wavelengths move toward long wavelengths, which corresponds that the thickness of the capping layer increases.

Referring to FIG. 10, the organic light-emitting device of Example 3 had better efficiency than that of the organic light-emitting device of Example 2 with respect to all the simulated wavelengths. That is, the organic light-emitting device having a structure of cathode/optical auxiliary layer (or intermediate layer)/cathode/optical auxiliary layer/capping layer was found to have higher efficiency than that of the organic light-emitting device having a structure of cathode/optical auxiliary layer/capping layer.

As described above, according to the one or more of the above exemplary embodiments, use of an optical auxiliary layer between a cathode and a capping layer may enhance light extraction efficiency and reduce light reflection in an efficient manner.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device comprising:
a substrate;
an anode on the substrate;
an organic layer on the anode and comprising an emission layer;
a cathode on the organic layer;
an optical auxiliary layer on the cathode; and
a capping layer on the optical auxiliary layer,
wherein, in a visible light region, the optical auxiliary layer has a lower refractive index and a higher absorption coefficient than of the capping layer.

2. The organic light-emitting device as claimed in claim 1, wherein, in a visible light region, the optical auxiliary layer has a refractive index in a range of about 1.1 to about 2.0 and an absorption coefficient in a range of about 1 to about 3.

3. The organic light-emitting device as claimed in claim 1, wherein the refractive index of the optical auxiliary layer is in a range of about 1.1 to about 1.5 in a wavelength region between about 400 nm to about 550 nm, and is in a range of about 1.5 to about 2 in a wavelength region between about 550 nm to about 700 nm.

4. The organic light-emitting device as claimed in claim 1, wherein a difference between the refractive index of the optical auxiliary layer and the refractive index of the capping layer is in a range of about 0.5 to about 2.0 in a wavelength region between about 400 nm and about 550 nm.

5. The organic light-emitting device as claimed in claim 4, wherein a difference between the refractive index of the optical auxiliary layer and the refractive index of the capping layer in a wavelength region between about 550 nm and about 700 nm is smaller than a difference between the refractive index of the optical auxiliary layer and the refractive index of the capping layer in the wavelength region between about 400 nm and about 550 nm.

6. The organic light-emitting device as claimed in claim 1, wherein the optical auxiliary layer has a higher absorption coefficient in a wavelength region between about 550 nm and about 700 nm than the optical auxiliary layer in a wavelength region between about 400 nm and about 550 nm.

7. The organic light-emitting device as claimed in claim 1, wherein the optical auxiliary layer includes ytterbium (Yb).

8. The organic light-emitting device as claimed in claim 1, wherein the organic layer further comprises:
a hole transport region between the anode and the emission layer; and
an electron transport region between the cathode and the emission layer.

9. The organic light-emitting device as claimed in claim 8, wherein the electron transport region includes an electron injection layer of a same material as the optical auxiliary layer.

10. The organic light-emitting device as claimed in claim 1, wherein the capping layer comprises a triarylamine derivative, a carbazole derivative, a benzimidazole derivative, a triazol derivative, ITO, IZO, $SiO_2$, $SiN_x$, $Y_2O_3$, $WO_3$, $MoO_3$, $Al_2O_3$, or a combination thereof.

11. The organic light-emitting device as claimed in claim 1, wherein the cathode includes a first metal of silver (Ag) and a second metal of at least one of aluminum (Al), platinum (Pt), ytterbium (Yb), neodymium (Nd), and magnesium (Mg), and a content of the first metal is greater than that of the second metal.

12. The organic light-emitting device as claimed in claim 1, wherein the anode is a reflective electrode.

13. The organic light-emitting device as claimed in claim 1, wherein the capping layer includes a plurality of layers having different refractive indices from each other.

14. The organic light-emitting device as claimed in claim 1, wherein the cathode further includes at least one intermediate layer, the intermediate layer being made of the same material as a material for forming the optical auxiliary layer.

15. The organic light-emitting device as claimed in claim 14, wherein the optical auxiliary layer and the intermediate layer include Yb.

16. A method of fabricating an organic light-emitting device, the method comprising:
providing a substrate;
forming an anode on the substrate;
forming an organic layer including an emission layer, on the anode;
forming a cathode on the organic layer;
forming an optical auxiliary layer on the cathode; and
forming a capping layer on the optical auxiliary layer,
wherein, in a visible light region, the optical auxiliary layer has a lower refractive index and a higher absorption coefficient than that of the capping layer.

17. The method as claimed in claim 16, wherein forming the optical auxiliary layer continuously occurs after forming the cathode, in a chamber that is the same as a chamber used for forming the cathode.

18. The method as claimed in claim 17, wherein:
the electron transport region includes an electron injection layer, and
he electron injection layer, the cathode, and the optical auxiliary layer are sequentially formed in the same chamber.

19. The method as claimed in claim 18, wherein the electron injection layer and the optical auxiliary layer are formed of the same materials.

20. The method as claimed in claim 19, wherein the optical auxiliary layer includes Yb.

* * * * *